US006931044B2

(12) United States Patent
Bour et al.

(10) Patent No.: US 6,931,044 B2
(45) Date of Patent: Aug. 16, 2005

(54) METHOD AND APPARATUS FOR IMPROVING TEMPERATURE PERFORMANCE FOR GAASSB/GAAS DEVICES

(75) Inventors: David P. Bour, Cupertino, CA (US); Michael R. T. Tan, Menlo Park, CA (US); Ying-Lan Chang, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 195 days.

(21) Appl. No.: 10/368,274

(22) Filed: Feb. 18, 2003

(65) Prior Publication Data

US 2004/0161005 A1 Aug. 19, 2004

(51) Int. Cl.[7] ................................................. H01S 5/00
(52) U.S. Cl. ............................. 372/46; 372/45; 372/50
(58) Field of Search ......................... 372/43–50; 257/94, 257/96

(56) References Cited

U.S. PATENT DOCUMENTS

| 4,703,488 | A | * | 10/1987 | Di Vita et al. ................. 372/44 |
| 5,218,613 | A | * | 6/1993 | Serreze ......................... 372/45 |
| 5,276,698 | A | * | 1/1994 | Yoshida et al. ................ 372/45 |
| 5,767,535 | A | | 6/1998 | Bachem et al. ............... 257/96 |
| 5,900,642 | A | * | 5/1999 | Nakatsu et al. ............... 257/25 |
| 6,434,180 | B1 | | 8/2002 | Cunningham ................ 372/50 |
| 6,546,031 | B1 | * | 4/2003 | Jewell et al. .................. 372/45 |
| 6,711,195 | B2 | * | 3/2004 | Chang et al. .................. 372/45 |
| 6,785,311 | B1 | * | 8/2004 | Najda ........................... 372/45 |
| 6,791,104 | B2 | * | 9/2004 | Tansu et al. ................... 257/14 |
| 6,801,558 | B2 | * | 10/2004 | Burak .......................... 372/43 |
| 2003/0123511 | A1 | * | 7/2003 | Johnson ........................ 372/98 |
| 2004/0161005 | A1 | * | 8/2004 | Bour et al. .................... 372/45 |

OTHER PUBLICATIONS

W. Braun, P. Dowd, C.–Z. Guo, S.–L. Chen, C.M. Ryu, U. Koelle, S.R. Johnson, Y.–H. Zhang, J.W. Tomm, T. Elsässer and D.J. Smith; *Strained InGaAs/GaPAsSb Heterostructures Grown on GaAs (001) for Optoelectronic Applications in the 1100–1500 nm Range*; Journal of Applied Physics, vol. 88, No. 5; Sep. 1, 2000; pp. 3004–3014.

Guobin Lin, Shun–Lien Chuang and Seoung–Hwan Park; *Optical Gain of Strained GaAsSb/GaAs Quantum–Well Lasers: A Self–Consistent Approach*; Journal of Applied Physics, vol. 88, No. 10; Nov. 15, 2000; pp. 5554–5561.

J. Hu, X.G. Xu, J.A.H. Stotz, S.P. Watkins, A.E. Curzon, M.L.W. Thewalt, N. Matine and C.R. Bolognesi; *Type II Photoluminescence and Conduction Band Offsets of GaAsSb/InGaAs and GaAsSb/InP Heterostructures Grown by Metalorganic Vapor Phase Epitaxy*; Applied Physics Letters, vol. 73, No. 19; Nov. 9, 1998; pp. 2799–2801.

Sang–Wan Ryu and P.C. Dapkus; *Low Threshold Current Density GaAsSb Quantum Well (Qw) Lasers Grown by Metal Organic Chemical Vapour Deposition on GaAs Substrates*; Electronics Letters, vol. 36, No. 16; Aug. 3, 2000; pp. 1387–1388.

(Continued)

*Primary Examiner*—Minsun Oh Harvey
*Assistant Examiner*—Delma R. Flores-Ruiz

(57) ABSTRACT

A method and apparatus is provided for improving the temperature performance of GaAsSb materials utilizing an AlGaInP confinement structure. An active region containing a GaAsSb quantum well layer and (In)GaAs barrier layers is sandwiched between two AlGaInP confinement layers. AlGaInP confinement structures provide sufficient electron confinement, thereby improving the stability of the threshold current with respect to increasing temperature for GaAsSb/GaAs heterostructures.

20 Claims, 4 Drawing Sheets

OTHER PUBLICATIONS

T. Anan, M. Yamada, K. Tokutome, S. Sugou, K. Nishi and A. Kamei; *Room–Temperature Pulsed Operation of GaAsSb/GaAs Vertical–Cavity Surface–Emitting Lasers*; Electronics Letters, vol. 35, No. 11; May 27, 1999; pp. 903–904.

T. Anan, K. Nishi, S. Sugou, M. Yamada, K. Tokutome and A. Gomyo; *GaAsSb: A Novel Material for 1.3µm VCSELs*; Electronics Letters, vol. 34, No. 22; Oct. 29, 1998; pp. 2127–2129.

M. Yamada, T. Anan, K. Kurihara, K. Nishi, K. Tokutome, A. Kamei and S. Sugou; *Room Temperature Low–Threshold CW Operation of 1.23 µm GaAsSb VCSELs on GaAs Substrates*; Electronics Letters, vol. 36, No. 7, Mar. 30, 2000; pp. 637–638.

F. Quochi, J.E. Cummingham, M. Dinu and J. Shah; *Room Temperature Operation of GaAsSb/GaAs Quantum Well VCSELs at 1.29 µm*; Electronics Letters, vol. 36, No. 25; Dec. 7, 2000; pp. 2075–2076.

\* cited by examiner

Single Quantum Well

Multiple Quantum Well (MQW)

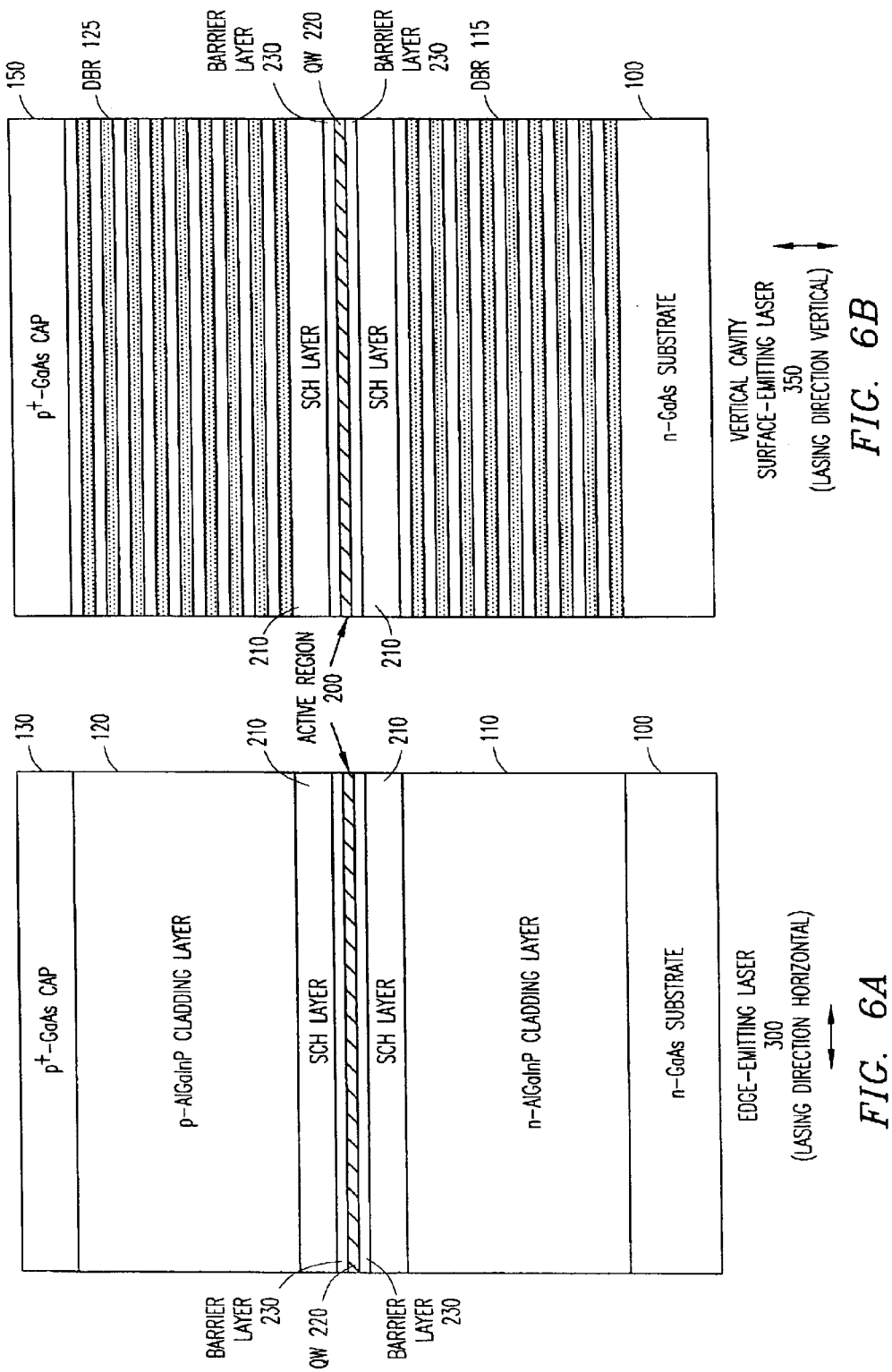

METHOD AND APPARATUS FOR IMPROVING TEMPERATURE PERFORMANCE FOR GAASSB/GAAS DEVICES

BACKGROUND OF THE INVENTION

1. Technical Field of the Invention

The present invention relates generally to GaAsSb devices, and specifically to improving temperature performance in GaAsSb semiconductor lasers.

2. Description of Related Art

Vertical-Cavity Surface-Emitting Lasers (VCSELs), Edge Emitting Lasers (EELs) and other types of semiconductor light emitting devices, such as quantum cascade lasers and light emitting diodes (LEDs), are becoming increasingly important for a wide variety of applications, including optical interconnect systems, optical computing systems and telecommunications systems. For high-speed optical fiber communications, emission wavelengths in the 1.2 to 1.6 $\mu$m range are desired. Various approaches to fabricating semiconductor light emitting devices in the 1.2 to 1.6 $\mu$m range have included using InGaAsP lattice matched to InP, wafer bonding of AlAs/GaAs to InP-based materials, using thallium compounds and using antimony compounds.

Recently, materials based on arsenide-antimonide compounds have become promising candidates for 1.2 to 1.6 $\mu$m optoelectronic devices grown on gallium arsenide (GaAs) substrates. For example, heterostructures fabricated using GaAsSb/GaAs materials have significant potential advantages for fabricating 1.2 $\mu$m VCSEL's due to the compatibility of the materials with well developed GaAs/AlAs distributed Bragg reflectors and AlAs oxidation techniques.

To reach a wavelength of 1.2 $\mu$m, a highly strained $GaAs_{1-x}Sb_x$ quantum well of antimony concentration $0.3<x<0.4$ is typically utilized with a type-II band alignment. The GaAsSb/GaAs type-II band alignment produces an optical transition that is indirect in real space, corresponding to recombination of electrons and holes across the interface between GaAs and GaAsSb. As compared with band-to-band (direct) transitions entirely within GaAsSb (type I band alignment), the indirect transition across the GaAs/GaAsSb interface requires less antimony concentration in the quantum well, resulting in reduced biaxial compression.

However, the electron confinement in type-II heterostructures is relatively weak compared to type-I heterostructures. As a result, the threshold current is especially temperature sensitive for type-II GaAsSb/GaAs heterostructures. The threshold current ($I_{th}$) is the minimal current required to establish the population inversion necessary for lasing, and can be expressed by the following temperature-dependent formula: $I_{th}(T)=I_0 e^{(T/T_o)}$. When a characteristic temperature ($T_o$) is large, the temperature dependence of the threshold current of the laser is small, and the stability of the laser during oscillation is higher, especially at high output power. GaAsSb quantum well lasers exhibit a characteristic temperature of approximately 45 K, as compared to $T_o>100K$ for InGaAsN quantum well lasers. Thus, when a GaAsSb/GaAs laser is operating at high temperatures, the threshold current required to produce lasing can be higher than a circuit specification allows.

One suggested solution for improving electron confinement is to embed the GaAsSb quantum well in AlGaAs. For example, in an article by Braun et al., entitled "Strained InGaAs/GaPAsSb heterostructures grown on GaAs (001) for optoelectronic applications in the 1100–1130 nm range," J. Appl. Phys. 88 (5), p. 3004 (2000), which is hereby incorporated by reference, the authors sandwiched the GaPAsSb/ InGaAs quantum well region between two doped and graded AlGaAs cladding layers to improve temperature performance of the device. However, even for a relatively high aluminum concentration of about 40%, the electron confinement barrier relative to the GaAsSb conduction band edge is still rather modest. Therefore, what is needed is an GaAsSb material structure capable of emitting in the 1.2 to 1.6 $\mu$m range with improved temperature performance.

SUMMARY OF THE INVENTION

Embodiments of the present invention provide a method and apparatus for improving the temperature performance of GaAsSb materials utilizing an AlGaInP confinement structure. AlGaInP materials have a significantly higher band gap than GaAs and GaAsSb and have a type-I band alignment with respect to GaAsSb, thereby facilitating effective electron confinement in the quantum well. In addition, AlGaInP materials can be lattice-matched to GaAs, enabling AlGaInP confinement layers to be easily grown on GaAs substrates.

In one embodiment, an active region containing a single GaAsSb quantum well layer is sandwiched between two AlGaInP confinement layers. The active region further contains a GaAs or InGaAs barrier layer adjacent to each side of the GaAsSb quantum well layer. In further embodiments, an active region containing multiple GaAsSb quantum well layers is sandwiched between two AlGaInP confinement layers. The active region further contains GaAs or InGaAs barrier layers separating the GaAsSb quantum well layers from one another and from the AlGaInP confinement layers.

AlGaInP confinement structures offer superior electron confinement in comparison with AlGaAs confinement structures. Therefore, the stability of the threshold current with respect to increasing temperature for GaAsSb/GaAs heterostructures using AlGaInP confinement structures is improved. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show important sample embodiments of the invention and which are incorporated in the specification hereof by reference, wherein:

FIGS. 6A and 6B illustrate exemplary semiconductor light-emitting devices having the structure of FIG. 3, in accordance with embodiments of the present invention.

DETAILED DESCRIPTION OF THE EXEMPLARY EMBODIMENTS

The numerous innovative teachings of the present application will be described with particular reference to the exemplary embodiments. However, it should be understood that these embodiments provide only a few examples of the many advantageous uses of the innovative teachings herein. In general, statements made in the specification do not necessarily delimit any of the various claimed inventions. Moreover, some statements may apply to some inventive features, but not to others.

All concentrations for chemical elements are provided below in ratios which range from 0.0 to 1.0, where 1.0 corresponds to 100% of an element group containing that element. For example, when discussing a group III or group V semiconductor material, the ratio applies to the concentration of the elements in either the group III or group V materials and not the entire semiconductor material. In addition, all concentrations disclosed herein are approximate values, regardless of whether the word "about" or "approximate" is used in connection therewith. The concentrations may vary by up to 1 mol percent, 2 mol percent, 5 mol percent or up to 10–20 mol percent, where a mol percent is a percentage expressed in terms of moles, rather than weight.

Embodiments of the present invention provide GaAsSb semiconductor light-emitting structures that exhibit improved temperature performance. Devices that include the GaAsSb semiconductor light-emitting structure of the present invention permit long-wavelength operation in the 1.2 μm to 1.6 μm range, while displaying reduced temperature sensitivity.

Figure 1:
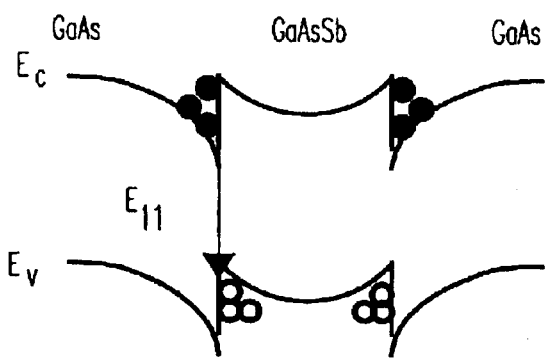
FIG. 1 is a schematic representation of the band structure of a GaAsSb/GaAs quantum well, with carrier injection.

FIG. 1 illustrates the band structure of a GaAsSb/GaAs heterostructure quantum well laser, with carrier injection. The band structure of FIG. 1 shows a type-II band alignment, in which the holes are confined by a potential well in the valence band of the GaAsSb quantum well layer and the electrons are confined by a barrier in the conduction band of the GaAs barrier layers. For a 1.2 μm laser (with a $GaAs_{0.65}Sb_{0.35}$ quantum well), the barrier height is estimated to be in the range of 100 meV–177 meV.

When carriers are injected into the GaAsSb/GaAs heterostructure, electrons in the GaAs barrier layers are attracted to the confined holes in the GaAsSb quantum well layer, and the charges are distributed across the quantum well interfaces. Recombination of holes and electrons results in the emission of light with photon energy ($E_{II}$) equal to the difference in energy between the valence band ($E_v$) of the GaAsSb quantum well layer and the conduction band ($E_c$) of the GaAs barrier layers. The charge distribution, with electrons localized in the GaAs barrier layers and holes in the GaAsSb quantum well layer, produces strong band-bending that offers some confinement.

However, the confinement is relatively weak compared to the confinement offered by type-I heterostructures, in which the optical transition is direct in real space. Thus, thermal variations in the type-II heterostructure shown in FIG. 1 can easily promote electrons into regions of the conduction band of the GaAs barrier layer that are not localized at the interface with the GaAsSb quantum well layer.

Figure 2:
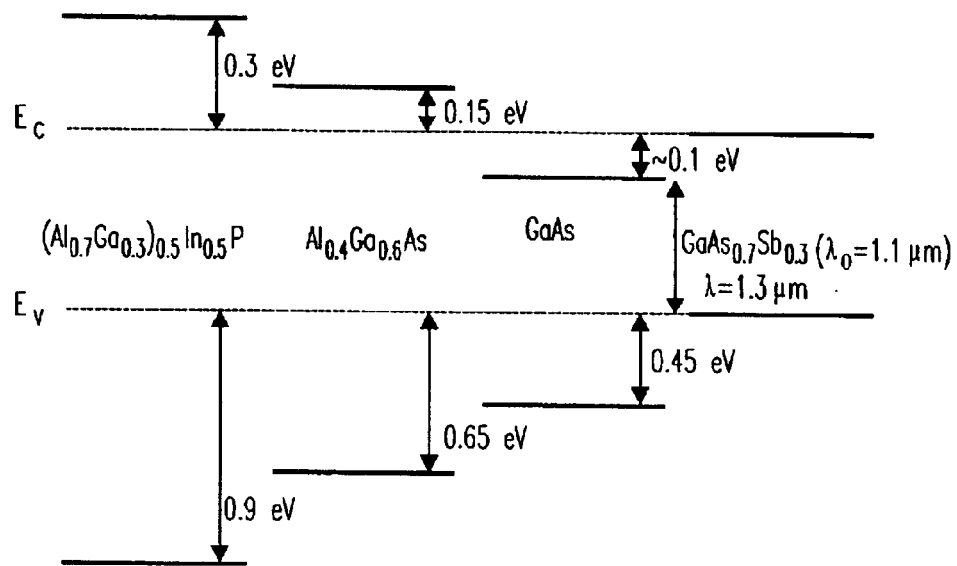
FIG. 2 is a schematic representation of the band alignments of GaAsSb heterostructures, with respect to GaAs, AlGaAs and AlGaInP.

The band alignment of $GaAs_{0.7}Sb_{0.3}$ heterostructures with respect to GaAs are shown in FIG. 2. As can be seen in FIG. 2, the conduction band energy level of GaAs is approximately 0.1 eV less than the conduction band energy level of GaAsSb. Thus, the indirect transition associated with the type-II band gap between the conduction band energy level ($E_c$) of GaAs and the valence band energy level ($E_v$) of GaAsSb produces light at the desired wavelength of 1.2 μm. By contrast, if the quantum well is a type-I quantum well, where the optical transition occurs entirely within the GaAsSb quantum well layer, the difference in the conduction band energy level between GaAsSb and GaAs results in light emitted at the wavelength of 1.1 μm.

In addition to showing the band alignments for GaAsSb and GaAs, FIG. 2 further illustrates the band alignments of $GaAs_{0.7}Sb_{0.3}$ heterostructures with respect to $Al_{0.4}Ga_{0.6}As$ and $(Al_{0.7}Ga_{0.3})_{0.5}In_{0.5}P$. As can be seen in FIG. 2, GaAs, $Al_{0.4}Ga_{0.6}As$ and $(Al_{0.7}Ga_{0.3})_{0.5}In_{0.5}P$ all provide sufficient hole confinement in the valence band (e.g., the valence band energy level difference between $GaAs_{0.7}Sb_{0.3}$ and GaAs is 0.45 eV, between $GaAs_{0.7}Sb_{0.3}$ and $Al_{0.4}Ga_{0.6}As$ is 0.65 eV and between $GaAs_{0.7}Sb_{0.3}$ and $(Al_{0.7}Ga_{0.3})_{0.5}In_{0.5}P$ is 0.9 eV). However, GaAs does not offer electron confinement in the conduction band (e.g., the conduction band energy level difference between $GaAs_{0.7}Sb_{0.3}$ and GaAs is –0.1 eV).

Although, $Al_{0.4}Ga_{0.6}As$ does offer some confinement for electrons in the conduction band, the conduction band energy level difference between $GaAs_{0.7}Sb_{0.3}$ and $Al_{0.4}Ga_{0.6}As$ is only 0.15 eV, which is not significant enough to provide sufficient electron confinement at higher temperatures. By contrast, the conduction band energy level difference between $GaAs_{0.7}Sb_{0.3}$ and $(Al_{0.7}Ga_{0.3})_{0.5}In_{0.5}P$ is 0.3 eV, which is double that of $Al_{0.4}Ga_{0.6}As$ and sufficient to provide electron confinement even at higher temperatures. Therefore, in accordance with embodiments of the present invention, an AlGaInP confinement structure can be utilized to improve temperature performance of GaAsSb light-emitting devices.

Figure 3:
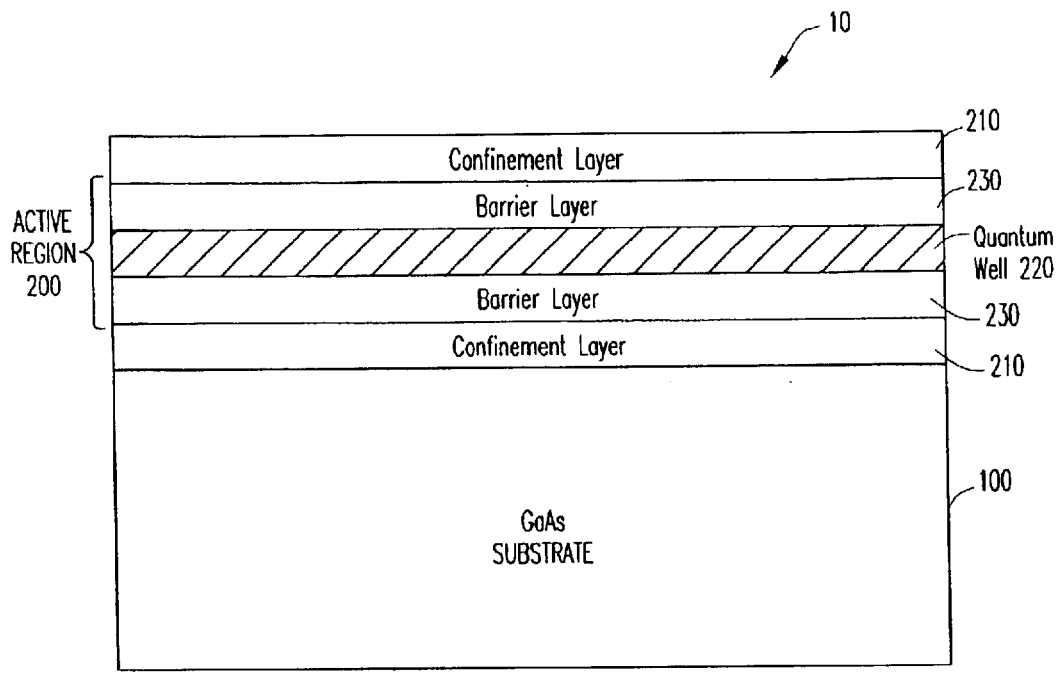
FIG. 3 is a simplified cross-sectional view illustrating an exemplary GaAsSb semiconductor light-emitting structure having an AlGaInP confinement structure, in accordance with embodiments of the present invention.

FIG. 3 shows a simplified cross-sectional view illustrating an exemplary semiconductor light-emitting structure 10 capable of emitting in the 1.2 μm to 1.5 μm range with improved temperature performance, in accordance with one embodiment of the present invention. The semiconductor light-emitting structure 10 can be a part of any light-emitting device. By way of example, but not limitation, the light-emitting device can be a vertical-cavity surface-emitting laser (VCSEL), edge emitting laser (EEL), or light emitting diode (LED).

The structure 10 includes a substrate 100 formed of a semiconductor material including Ga and As, an active region 200 including a GaAsSb light-emitting quantum well 220 sandwiched between two barrier layers 230 of (In)GaAs and a confinement structure formed of two AlGaInP confinement layers 210. It should be appreciated that the substrate 100 may include any material underneath the active region 200. For example, mirror layers, waveguide layers and cladding layers may form a part of the substrate 100.

The material of the quantum well 220 is a gallium arsenic antimony material according to the formula $GaAs_xSb_{1-x}$, in which x ranges from approximately 0.5 to approximately 0.9, and preferably from approximately 0.6 to approximately 0.7. For example, a suitable GaAsSb composition is $GaAs_{0.7}Sb_{0.3}$. The GaAsSb quantum well 220 has a thickness ranging from approximately 5 nm to approximately 20 nm.

The active region 200 further includes (In)GaAs barrier layers 230 on either side of the GaAsSb quantum well 220. For example, a $GaAs_xSb_{1-x}$ (0.6<x<0.7) quantum well 220 sandwiched between two $In_{0.1}Ga_{0.9}As$ barrier layers 230 can emit light at the wavelength of 1.2 μm–1.6 μm. Each barrier layer 230 has a thickness ranging from approximately 5 nm to approximately 20 nm. The GaAsSb/GaAs heterostructure 200 provides a type-II band alignment for emission in the desired wavelength range. For example, the compositions of the materials of the GaAsSb quantum well 220 and (In) GaAs barrier layers 230 are selected so that the GaAsSb quantum well 220 has a conduction band energy level at least 0.1 eV greater than the conduction band energy level of the (In)GaAs barrier layer 230 in order to enable an indirect optical transition having a wavelength of at least 1.2 $\mu$m. The GaAsSb quantum well 220 and barrier layers 230 can be pseudomorphically grown over the GaAs substrate 100 using any known epitaxial growth technique. For example, such techniques include, but are not limited to, MBE, MOVPE, MOCVD or MOMBE.

Figure 4A:
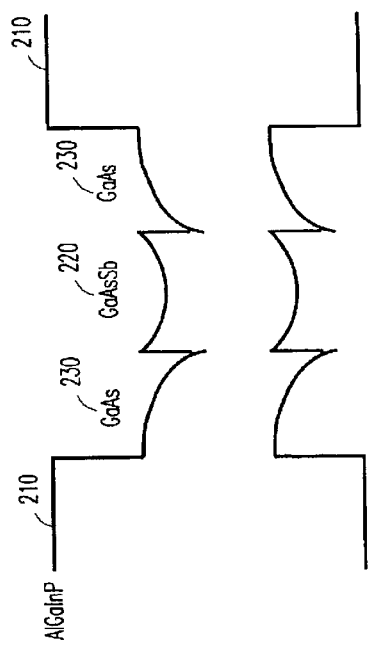
FIGS. 4A and 4B are schematic representations of a single quantum well GaAsSb/GaAs heterostructure and a multiple quantum well GaAsSb/GaAs heterostructure, respectively.
Figure 4B:
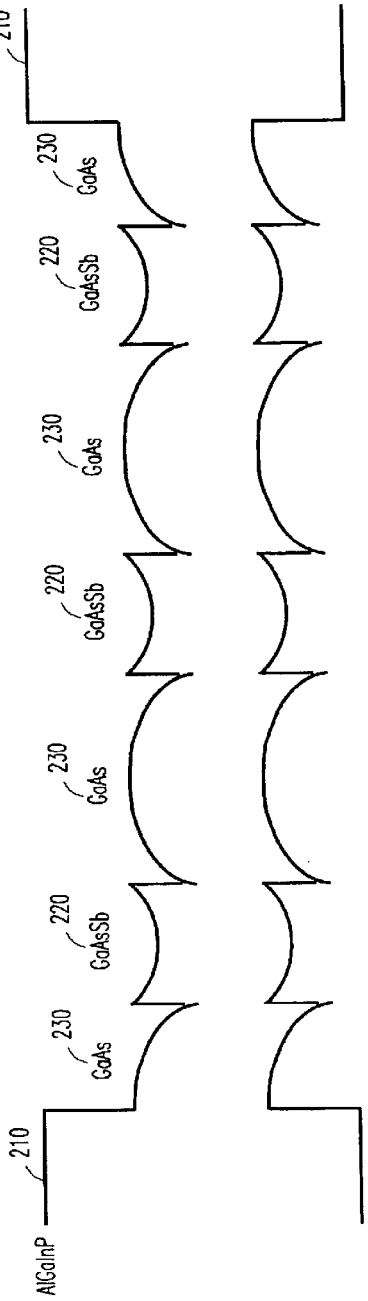

The GaAsSb quantum well 220 can have either a single quantum well (SQW) structure, as shown in FIG. 4A, or a multiple quantum well (MQW) structure, as shown in FIG. 4B. In the SQW structure of FIG. 4A, a GaAs barrier layer 230 is provided adjacent to opposing surfaces of the GaAsSb quantum well 220 to separate the GaAsSb quantum well 220 from the AlGaInP confinement layers 210 and to provide the type-II band alignment necessary for lasing at the desired wavelength. In the MQW structure of FIG. 4B, a single GaAs barrier layer 230 is provided between each of the GaAsSb quantum well layers 220 and between the outer GaAsSb quantum well layers 220 and the AlGaInP confinement layers 210.

Referring again to FIG. 3, the confinement structure includes two confinement layers 210 surrounding the active region 200. Each confinement layer 210 has a thickness of approximately 20 nm to approximately 200 nm. The two confinement layers 210 are preferably formed of a material comprising the elements aluminum, gallium, indium and phosphorus. The two AlGaInP confinement layers 210 are substantially lattice-matched to the GaAs substrate 100.

Suitable AlGaInP materials for the confinement layers 210 have a composition according to the formula $(Al_aGa_{1-a})_xIn_{1-x}P$, where a ranges from approximately 0.01 to approximately 0.99 and x ranges from approximately 0.1 to approximately 0.8. In exemplary embodiments, for the formula $(Al_aGa_{1-a})_xIn_{1-x}P$, a ranges from approximately 0.2 to approximately 0.9, and preferably from approximately 0.6 to approximately 0.8, and x ranges from approximately 0.3 to approximately 0.7, and preferably from approximately 0.4 to approximately 0.6. For example, a suitable AlGaInP material is $(Al_{0.7}Ga_{0.3})_{0.5}In_{0.5}P$. The confinement layers 210 can be formed by any available technique. For example, such techniques include, but are not limited to, MBE, MOVPE, MOCVD or MOMBE.

Figure 5:
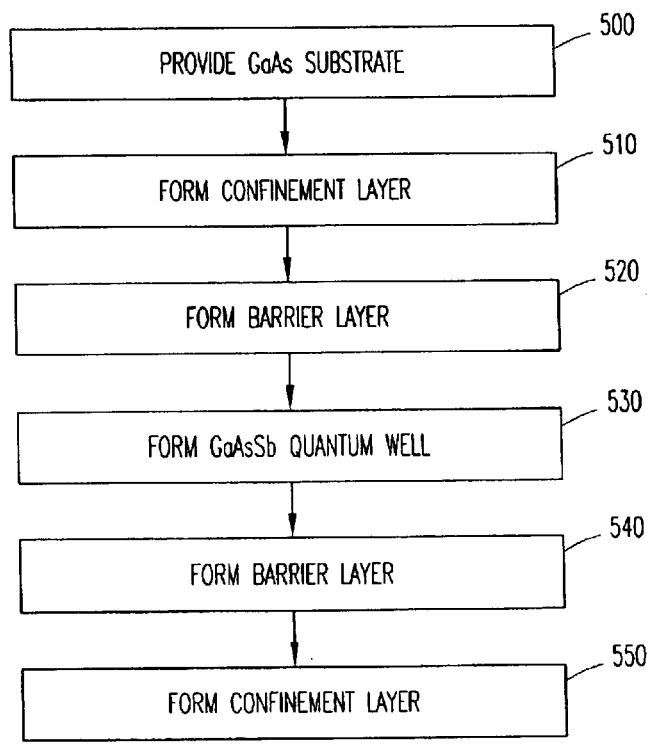
FIG. 5 is a flow chart illustrating exemplary simplified blocks for fabricating a semiconductor light-emitting structure having an active region and confinement structure as shown in FIG. 3.

FIG. 5 is a flow chart illustrating a simplified exemplary process for fabricating a semiconductor light-emitting structure as shown in FIG. 3. To form the light-emitting structure, a first confinement layer containing AlGaInP is formed above a substrate (blocks 500 and 510). By way of example, the substrate is a semiconductor substrate containing gallium arsenide (GaAs) doped with an impurity material or dopant of the N conductivity type, such as silicon. The first confinement layer may be epitaxially grown above the substrate using, for example, MBE, MOVPE, MOCVD or MOMBE, and has a thickness ranging from approximately 20 nm to approximately 200 nm. In addition, the first confinement layer is substantially lattice-matched to the GaAs substrate.

A first barrier layer containing (In)GaAs is formed above the first confinement layer (block 520). The first barrier layer may be epitaxially grown above the substrate using, for example, MBE, MOVPE, MOCVD or MOMBE, and has a thickness ranging from approximately 5 nm to approximately 20 nm. A light-emitting quantum well layer containing GaAsSb is formed over the first confinement layer (block 530) using any epitaxial growth technique. The GaAsSb quantum well has a thickness ranging from approximately 5 nm to approximately 20 nm, with an antimony concentration of 30%–40%. The GaAsSb quantum well has a conduction band energy level at least 0.1 eV greater than the conduction band energy level of the first barrier layer in order to enable an indirect optical transition having a wavelength of at least 1.2 $\mu$m.

A second barrier layer having substantially the same composition and thickness as the first barrier layer is formed above the GaAsSb quantum well layer (block 540), using any epitaxial growth technique. A second confinement layer having substantially the same composition and thickness as the first confinement layer is formed over the GaAsSb quantum well (block 550), using any epitaxial growth technique. The confinement layers serve to confine electrons to the conduction band of the (In)GaAs layer even at higher temperatures to improve temperature performance of the structure.

FIGS. 6A and 6B illustrate exemplary semiconductor light-emitting devices having the structure of FIG. 3, in accordance with embodiments of the present invention. Referring now to FIG. 6A, there is illustrated an exemplary edge-emitting laser 300 formed with the structure 10 shown in FIG. 3. The edge-emitting laser 300 includes a single crystal substrate 100 formed of gallium arsenide. The substrate 100 can be doped with, for example, an n-type dopant, such as silicon. The substrate 100 can range in thickness from about 100 $\mu$m to about 500 $\mu$m.

A cladding layer 110 having a thickness ranging between about 0.5 $\mu$m and about 5 $\mu$m is formed on the substrate 100. A suitable material for the cladding layer 110 is aluminum gallium indium phosphide (AlGaInP). By way of example, the cladding layer 110 can be $(Al_{0.7}Ga_{0.3})_{0.5}In_{0.5}P$ doped with an n-type dopant having a concentration of approximately $10^{18}$ atoms/cm$^3$.

A confinement or undoped layer 210 having a thickness ranging between approximately 20 nm and approximately 100 nm is formed on the cladding layer 110. The confinement layer 210 is also referred to as a Separate Confinement Heterostructure (SCH) or an undoped cladding layer. A suitable material for the SCH layer 210 is AlGaInP that has a higher bandgap than that of the material of the quantum well(s) 220 in the active region 200 disposed over the SCH layer 210. For example, the SCH layer 210 can be $(Al_{0.3}Ga_{0.7})_{0.5}In_{0.5}P$. The SCH layer 210 is also referred to as an n-side SCH layer.

An active region 200 having a thickness ranging between 13 nm and 300 nm is formed over the n-side SCH layer 210. The active region 200 includes one or more GaAsSb quantum well layers 220, each having a thickness ranging from approximately 5 nm to approximately 20 nm, and a corresponding number of (In)GaAs barrier layers 230 separating the quantum well layers 220, where each of the barrier layers 210 has a thickness ranging from approximately 5 nm to approximately 20 nm. By way of example, the active region 200 includes one GaAsSb quantum well layer 220 sandwiched between two (In)GaAs barrier layers 230, as described above. Thus, a first (In)GaAs barrier layer 230 is formed over the SCH layer 210, the GaAsSb quantum well layer 220 is formed over the first (In)GaAs barrier layer 230 and a second (In)GaAs barrier layer 230 is formed over the GaAsSb quantum well layer 220. Each GaAsSb quantum well 220 has an antimony concentration of 30%–40%. For example, in one embodiment, the quantum well material can be GaAs$_{0.7}$Sb$_{0.3}$.

A p-side SCH layer 210 having a thickness ranging between approximately 20 nm and 100 nm is formed on the active region 200. A suitable material for the p-side SCH layer 210 is AlGaInP that has a wider bandgap than that of the quantum well(s) 220 in the active region 200. For example, the p-side SCH layer 210 can be (Al$_{0.3}$GA$_{0.7}$)$_{0.5}$In$_{0.5}$P.

A p-type cladding layer 120 having a thickness ranging between approximately 0.5 $\mu$m and approximately 5 $\mu$m is formed over the p-side SCH layer 210. A suitable material for the p-type cladding layer 120 is aluminum gallium indium phosphide (AlGaInP). By way of example, the p-type cladding layer 120 can be (Al$_{0.7}$Ga$_{0.3}$)$_{0.5}$In$_{0.5}$P doped with a p-type dopant having a concentration of approximately 5×10$^{17}$ atoms/cm$^3$.

A capping layer 130 having a thickness ranging between approximately 5 nm and approximately 500 nm is formed over the p-type cladding layer 120 to serve as a contact layer. A suitable material for the capping layer 130 is gallium arsenide (GaAs) that is highly p-doped and of a lower band gap energy than the p-type cladding layer 120. This provides a lower Schottky barrier at the interface between the capping layer 130 and a metal electrode (not shown) formed thereon. By way of example, the capping layer 130 can be GaAs doped with a p-type dopant having a concentration greater than approximately 1×10$^{19}$ atoms/cm$^3$. All of the layers described above can be formed using any conventional or other suitable technique, such as MBE, MOVPE, MOCVD or MOMBE.

Referring now to FIG. 6B, there is illustrated an exemplary vertical-cavity surface-emitting laser (VCSEL) 350 formed with the structure 10 shown in FIG. 3. The VCSEL 350 includes a single crystal substrate 100 formed of gallium arsenide. The substrate 100 can be doped with, for example, an n-type dopant, such as silicon. The substrate 100 can range in thickness from about 100 $\mu$m to about 500 $\mu$m.

A first quarter wave stack 115 having a thickness ranging between about 0.1 $\mu$m and about 10 $\mu$m is formed on the substrate 100. The first quarter wave stack is also referred to as a mirror stack or a distributed Bragg reflector (DBR). A VCSEL 350 is typically fabricated to operate at a particular wavelength, referred to as the lasing wavelength. To enable the VSCEL 350 to emit light at the lasing wavelength, the DBR 115 material is typically transparent at the lasing wavelength. Usually, the first DBR 115 contains alternating layers of different n-type materials. Suitable materials for the n-type DBR 115 include alternating layers of n-type aluminum arsenide (AlAs) and gallium arsenide (GaAs). In addition, the thickness of each layer can be equal to one-quarter of the lasing wavelength divided by the refractive index. The number of periods of pairs of alternating layers determines the reflectivity of the DBR mirror 115. Typically, the number of periods for the n-type DBR 115 ranges from 20 to 40.

An n-side SCH layer 210 having a thickness ranging between approximately 20 nm and approximately 100 nm is formed on the DBR layer 115. A suitable material for the SCH layer 210 is AlGaInP that has a higher bandgap than that of the material of the quantum well(s) 220 in the active region 200 disposed over the SCH layer 210. For example, the SCH layer 210 can be (Al$_{0.7}$Ga$_{0.3}$)$_{0.5}$In$_{0.5}$P.

An active region 200 having a thickness ranging between about 20 nm and about 300 nm is formed over the n-side SCH layer 210. The active region 200 includes one or more GaAsSb quantum well layers 220, each having a thickness ranging from approximately 5 nm to approximately 20 nm, and a corresponding number of (In)GaAs barrier layers 230 separating the quantum well layers 220, where each of the barrier layers 210 has a thickness ranging from approximately 5 nm to approximately 20 nm. By way of example, the active region 200 includes one GaAsSb quantum well layer 220 sandwiched between two (In)GaAs barrier layers 230, as described above. Thus, a first (In)GaAs barrier layer 230 is formed over the SCH layer 210, the GaAsSb quantum well layer 220 is formed over the first (In)GaAs barrier layer 230 and a second (In)GaAs barrier layer 230 is formed over the GaAsSb quantum well layer 220. Each GaAsSb quantum well 220 has an antimony concentration of 30%–40%. For example, in one embodiment, the quantum well material can be GaAs$_{0.7}$Sb$_{0.3}$.

A p-side SCH layer 210 having a thickness ranging between approximately 20 nm and approximately 100 nm is formed on the active region 200. The p-side SCH layer 210 is an undoped cladding layer. A suitable material for the p-side SCH layer 210 is AGaInP that has a wider bandgap than that of the quantum well(s) 220 in the active region 200. For example, the p-side SCH layer 210 can be (Al$_{0.7}$Ga$_{0.3}$)$_{0.5}$In$_{0.5}$P.

A p-type DBR 125 having a thickness ranging between approximately 0.1 $\mu$m and about 10 $\mu$m is formed over the p-side SCH layer 210. Suitable materials for the p-type DBR 125 include alternating layers of p-type aluminum arsenide (AlAs) and gallium arsenide (GaAs). As with the n-type DBR 115, the thickness of each layer in the p-type DBR 125 can be equal to one-quarter of the lasing wavelength divided by the refractive index. The number of periods of pairs of alternating layers for the p-type DBR 125 ranges from 20 to 25. The n-type DBR 115, SCH layers 210, active region 200 and p-type DBR 125 form an optical cavity characterized by a cavity resonance at the lasing wavelength.

A capping layer 130 having a thickness ranging between approximately 5 nm and approximately 500 nm is formed over the p-type DBR 125 to serve as a contact layer. A suitable material for the capping layer 130 is gallium arsenide (GaAs) that is highly p-doped and of a lower band gap energy than the p-type DBR 125. This provides a lower Schottky barrier at the interface between the capping layer 130 and a metal electrode (not shown) formed thereon. By way of example, the capping layer 130 can be GaAs doped with a p-type dopant having a concentration greater than approximately 1×10$^{19}$ atoms/cm$^3$. All of the layers described above can be formed using any conventional or other suitable technique, such as MBE, MOVPE, MOCVD or MOMBE.

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

We claim:

1. A semiconductor light-emitting structure, comprising:
a substrate including gallium arsenide, said substrate having a surface;
an active region including a quantum well layer disposed over the surface of said substrate, said quantum well layer having opposing surfaces, said quantum well layer being formed of a material including gallium, arsenic and antimony, said active region further including first and second barrier layers each of a barrier material capable of providing an optical transition of at least 1.2 µm, each of said first and second barrier layers being disposed adjacent to one of said opposing surfaces of said quantum well layer; and a confinement structure of a confinement material having a conduction band energy level greater than a conduction band energy level of said quantum well layer by more than 0.15 eV, said confinement structure surrounding said active region.

2. The structure of claim 1, wherein said quantum well layer has a thickness ranging from 5 nm to 20 nm.

3. The structure of claim 1, wherein said quantum well layer has an antimony concentration between 30 and 40 percent.

4. The structure of claim 3, wherein said barrier material contains at least gallium and arsenic.

5. The structure of claim 1, wherein each of said first and second barrier layers has a thickness ranging from 5 nm to 20 nm.

6. The structure of claim 1, wherein said confinement material comprises an aluminum gallium indium phosphide material.

7. The structure of claim 6, wherein the aluminum gallium indium phosphide material has a composition according to the formula $(Al_aGa_{1-a})_xIn_{1-x}P$, where:

a ranges from approximately 0.01 to approximately 0.99; and x ranges from approximately 0.1 to approximately 0.8.

8. The structure of claim 7, wherein the aluminum gallium indium phosphide material has a composition according to the formula $(Al_aGa_{1-a})_xIn_{1-x}P$, where:

a ranges from approximately 0.4 to approximately 0.9; and x ranges from approximately 0.2 to approximately 0.7.

9. The structure of claim 8, wherein the aluminum gallium indium phosphide material has a composition according to the formula $(Al_aGa_{1-a})_xIn_{1-x}P$, where:

a ranges from approximately 0.6 to approximately 0.8; and x ranges from approximately 0.3 to approximately 0.6.

10. The structure of claim 9, wherein the aluminum gallium indium phosphide material is $(Al_{0.7}Ga_{0.3})_{0.5}In_{0.5}P$.

11. The structure of claim 1, wherein said first barrier layer is disposed over the surface of said substrate, said quantum well layer is disposed over said first barrier layer and said second barrier layer is disposed over said quantum well layer, and wherein said confinement structure comprises:

a first confinement layer disposed between the surface of said substrate and said first barrier layer; and a second confinement layer disposed over said second barrier layer.

12. A method of manufacturing a semiconductor light-emitting structure, comprising:

providing a substrate including gallium arsenide, said substrate having a surface;

forming an active region over the surface of said substrate, the forming comprising:

forming a quantum well layer having opposing surfaces, said quantum well layer including gallium, arsenic and antimony, and forming first and second barrier layers each of a barrier material capable of providing an optical transition of at least 1.2 µm, each of said first and second barrier layers being disposed adjacent to one of said opposing surfaces of said quantum well layer, and forming a confinement structure of a confinement material having a conduction band energy level greater than a conduction band energy level of said quantum well layer by more than 0.15 eV said confinement structure surrounding said active region.

13. The method of claim 12, wherein said quantum well layer has an antimony concentration between 30 and 40 percent.

14. The method of claim 13, wherein said barrier material contains at least gallium and arsenic.

15. The method of claim 13, wherein said confinement material comprises an aluminum gallium indium phosphide material.

16. The method of claim 15, wherein the aluminum gallium indium phosphide material has a composition according to the formula $(Al_aGa_{1-a})_xIn_{1-x}P$, where:

a ranges from approximately 0.01 to approximately 0.99; and x ranges from approximately 0.1 to approximately 0.8.

17. The method of claim 16, wherein the aluminum gallium indium phosphide material has a composition according to the formula $(Al_aGa_{1-a})_xIn_{1-x}P$, where:

a ranges from approximately 0.4 to approximately 0.9; and x ranges from approximately 0.2 to approximately 0.7.

18. The method of claim 17, wherein the aluminum gallium indium phosphide material has a composition according to the formula $(Al_aGa_{1-a})_xIn_{1-x}P$, where:

a ranges from approximately 0.6 to approximately 0.8; and x ranges from approximately 0.3 to approximately 0.6.

19. The method of claim 18, wherein the aluminum gallium indium phosphide material is $(Al_{0.7}Ga_{0.3})_{0.5}In_{0.5}P$.

20. The method of claim 12, wherein said first barrier layer is disposed over the surface of said substrate, said quantum well layer is disposed over said first barrier layer and said second barrier layer is disposed over said quantum well layer, and wherein said forming said confinement structure further comprises:

forming a first confinement layer disposed between the surface of said substrate and said first barrier layer; and forming a second confinement layer disposed over said second barrier layer.

* * * * *